United States Patent [19]

Yamaguchi et al.

[11] Patent Number: 5,116,782

[45] Date of Patent: May 26, 1992

[54] METHOD AND APPARATUS FOR PROCESSING A FINE PATTERN

[75] Inventors: Hiroshi Yamaguchi; Keiya Saito; Tateoki Miyauchi, all of Kanagawa, Japan

[73] Assignee: Hitachi, Ltd., Tokyo, Japan

[21] Appl. No.: 455,155

[22] Filed: Dec. 22, 1989

[30] Foreign Application Priority Data

Dec. 26, 1988 [JP] Japan .................. 63-325768

[51] Int. Cl.$^5$ .................. H01L 21/302; H01L 21/326
[52] U.S. Cl. ..................... 437/172; 437/225; 148/DIG. 45
[58] Field of Search ............... 437/225, 228, 170, 172; 148/DIG. 45, DIG. 46; 250/306, 307, 311, 492.2, 492.3

[56] References Cited

U.S. PATENT DOCUMENTS

| | | | |
|---|---|---|---|
| 4,343,993 | 8/1982 | Binnig et al. | 250/306 |
| 4,550,257 | 10/1985 | Binnig et al. | 250/492.2 |
| 4,724,318 | 2/1988 | Binnig | 250/306 |

FOREIGN PATENT DOCUMENTS

| | | |
|---|---|---|
| 0166119 | 1/1986 | European Pat. Off. |
| 0026936 | 2/1988 | Japan . |
| 0092025 | 4/1988 | Japan . |
| 0265102 | 11/1988 | Japan . |

OTHER PUBLICATIONS

Hansma, P. K. et al., "Scanning Funneling Microscopy", J. Appl. Phys., vol. 61, No. 2, pp. R1-R23, Jan. 15, 1987.

Becker, R. S. et al, "Atomic-Scale Surface Modifications Using a Tunneling Microscope", Nature, vol. 325, pp. 419-421, Jan. 29, 1987.

Ehrichs, E. E. et al, "Direct Writing with the Scanning Tunneling Microscope", J. Vac. Sci. Tech. A, vol. 6, No. 2, Mar./Apr. 1988, pp. 540-543.

McCord, M. A. et al, "Lithography . . . Microscope", J. Vac. Sci. Tech. B, vol. 4, No. 1, Jan./Feb. 1986, pp. 86-88.

Abraham, D. W. et al., "Surface Modification . . . Tunneling Microscope", IBM J. Res Develop., vol. 30, No. 5, Sep. 1986, pp. 492-499.

Gomer, R., "Possible Mechanisms . . . Tunneling Microscopy", IBM J. Res. Develop., vol. 30, No. 4, Jul. 1986, pp. 428-430.

*Primary Examiner*—Brian E. Hearn
*Assistant Examiner*—C. Chaudhari
*Attorney, Agent, or Firm*—Antonelli, Terry, Stout & Kraus

[57] ABSTRACT

A method and apparatus for processing a fine pattern of a sample of one of an electronic device, molecular device and bioelement device; wherein a needle having a sharpened tip is disposed in opposed relation to the sample with a gap therebetween. A voltage is applied between the needle and the sample so as to enable a tunnel current and/or a field emission current to flow therebetween and the fine pattern is provided to correct the fine pattern by effecting at least one of removal, repositioning, annealing and film formation of at least one of individual atoms and individual molecules.

13 Claims, 15 Drawing Sheets

METHOD AND APPARATUS FOR PROCESSING A FINE PATTERN

BACKGROUND OF THE INVENTION

The present invention relates to a method and appara for processing a fine pattern to provide a structure in the unit of an atom or molecule such as film formation and processing of patterns of ultra-fine structures. Examples are the fabrication and correction of ultra-fine patterns such as LSI and patterns of various structures such as molecular devices and bioelements.

The pattern of a semiconductor integrated circuit is becoming more and more fine every year, and the related lithography mask drawing technique, the defect correcting technique and the technique for correcting integrated circuit patterns formed thereby, also have a requirement to become finer.

As to the correction of defects of such mask for lithography, cutting of the internal wiring of the element, the formation of upper and lower wirings, the formation of window and that of jumper wire, there is known a method in which processing such as removal, cutting and perforation are performed using a focused ion beam, and connection, stopgap for forming a take-out electrode and the formation of jumper wire are performed using ion beam induced or laser induced CVD, as disclosed in Japanese Patent Laid-Open Nos. 56332/83, 168652/84 and 229956/87.

With an increase in the degree of degradation of a semiconductor integrated circuit and with the development of molecular electro-elements and molecular bio-electro-elements, patterns are becoming more and more fine. For example, in the case of a mask used in a projection type ion beam lithography or a projection type electron beam lithography, an ultra-fine defect causes a problem. More particularly, for a circuit pattern of 0.3 $\mu$m it is necessary to oorrect a defect of 0.07 $\mu$m or more, and for a circuit pattern of 0.1 $\mu$m it is necessary to correct a defect of 0.02 $\mu$m or more. On the other hand, also in a ULSI, in the event of malfunction due to design error or process error, it is necessary to use a correction technique for the cutting or connection of wiring.

In the above prior art, in the case of using an ion beam from a liquid metal ion source, because of a large effective diameter of the ion source which is 20 to 30 nm and because of a large energy width which is several ten eV, the minimum spot diameter has encountered a lower limit of 50 nm or so even when focusing is made at a high magnification using a multi-stage lens. On the other hand, in the case of using an ion source which ionizes H2 gas or Ar gas by electric field ionization at the tip of a needle which has been cooled to an extremely low temperature of about the temperature of liquid He, and then withdraws an ion beam, it is theoretically possible to effect focusing to a minimum of 10 nm or so because the effective diameter of the ion source is as small as one to several atoms at the needle tip and the energy width is as small as one to several eV. However, many extreme conditions are required; for example, an extremely precise technique is required for the production of the needle, and it is necessary to use an ultra-low temperature and a high voltage in ultra-high vacuum. Thus, it is necessary to solve many problems for practical use.

Moreover, molecular electronic elements and bioelectronic elements are under study. The molecular electronics element uses a molecule as a switching element as one limit of element attenuation. The bioelement is constituted by living body related molecules and employs molecules like those in a living body as an information transfer medium by combining molecules of A order having function.

Scanning tunneling microscopes (STM) are known for observation of atoms of a sample and have also been suggested for atomic scale surface modification by atom removal or the like as disclosed in Japanese Patent Application Laid-Open No. 63-92025 having a Laid-Open date of Apr. 4, 1988 and in "Atomic-scale surface modifications using a tunneling microscope", Becker et al, Nature, Vol. 325, Jan. 29, 1987, pp. 419-421. However, such disclosures are not directed to processing of a fine pattern to correct a defect or the like therein or to form a film nor to the processing of molecular devices.

Moreover, such prior art do not disclose a technique capable of performing the correction of defects, cutting and perforation of an ultra-fine pattern not wider than 0.2 $\mu$m such as a thin multi-layered film of an inorganic material, as well as processing, movement and adhesion, i.e., repositioning, in the unit of atom or molecule or a group of atoms or molecules in molecular devices using organic high polymers or biopolymers.

It is therefore an object of the present invention to provide a method and apparatus for processing a fine pattern which method and apparatus enable correction of defects of an ultra-fine pattern not wider than 0.2 $\mu$m of an electronic device and/or effect operations in the unit of an atom or molecule or a group of atoms or molecules in devices using organic high polymers or biopolymers, and thereby enabling fabrication of a device of ultra-high integration density, a high function device and a device which permits information coupling with living bodies.

In accordance with the present invention, a method and apparatus for processing an ultra-fine pattern utilizes a scanning tunneling microscope system. More specifically, if a scanning tunneling microscope with a needle having a sharp tip is drawn close to a sample surface to be processed at a distance of about 1 nm or less and voltage is applied between the sample and the needle, there will flow a tunnel current therebetween. If the distance is 3 nm or more, there will flow a field emission current. In this case, the tunnel current will flow between the atoms in the needle tip and the sample surface, and the field emission current will spread only several nm on the sample surface because of an extremely short distance. Thus, by various processes using this electric current, processing, alteration or film formation of an ultra-fine pattern, or removing and adding operations in the unit of an atom or molecule are enabled.

The above and other objects, features, and advantages of the present invention will become more apparent from the following description when taken in connection with the accompanying drawings which show, for the purposes of illustration only, several embodiments in accordance with the present invention.

BRIEF DESCRIPTION OF THE DRAWINGS

FIGS. 8(a-c) show removal of an atom or molecule from a sample.

FIGS. 9(a-b) show the manner of processing an insulating material.

FIGS. 10(a-d) show atom film formation utilizing a gas.

FIGS. 11(a-b) show atom removal utilizing a gas.

FIGS. 12(a-c) show annealing of a part of a sample.

FIGS. 13(a-f) show atom film formation utilizing a gas with radicalizing, ionizing or exciting electrons and molecules of the gas.

FIGS. 14(a-b) show atom film formation in different layer utilizing different gases.

FIGS. 15(a-e) show atom removal by vaporization utilizing a gas.

FIGS. 16(a-c) show atom removal utilizing a gas for ionization and collision to induce a sputtering action.

FIGS. 17(a-g) show atom repositioning by polarity switching and relative movement of the sample and scanning tunneling microscope.

DETAILED DESCRIPTION OF THE PREFERRED EMBODIMENTS

Figure 1:
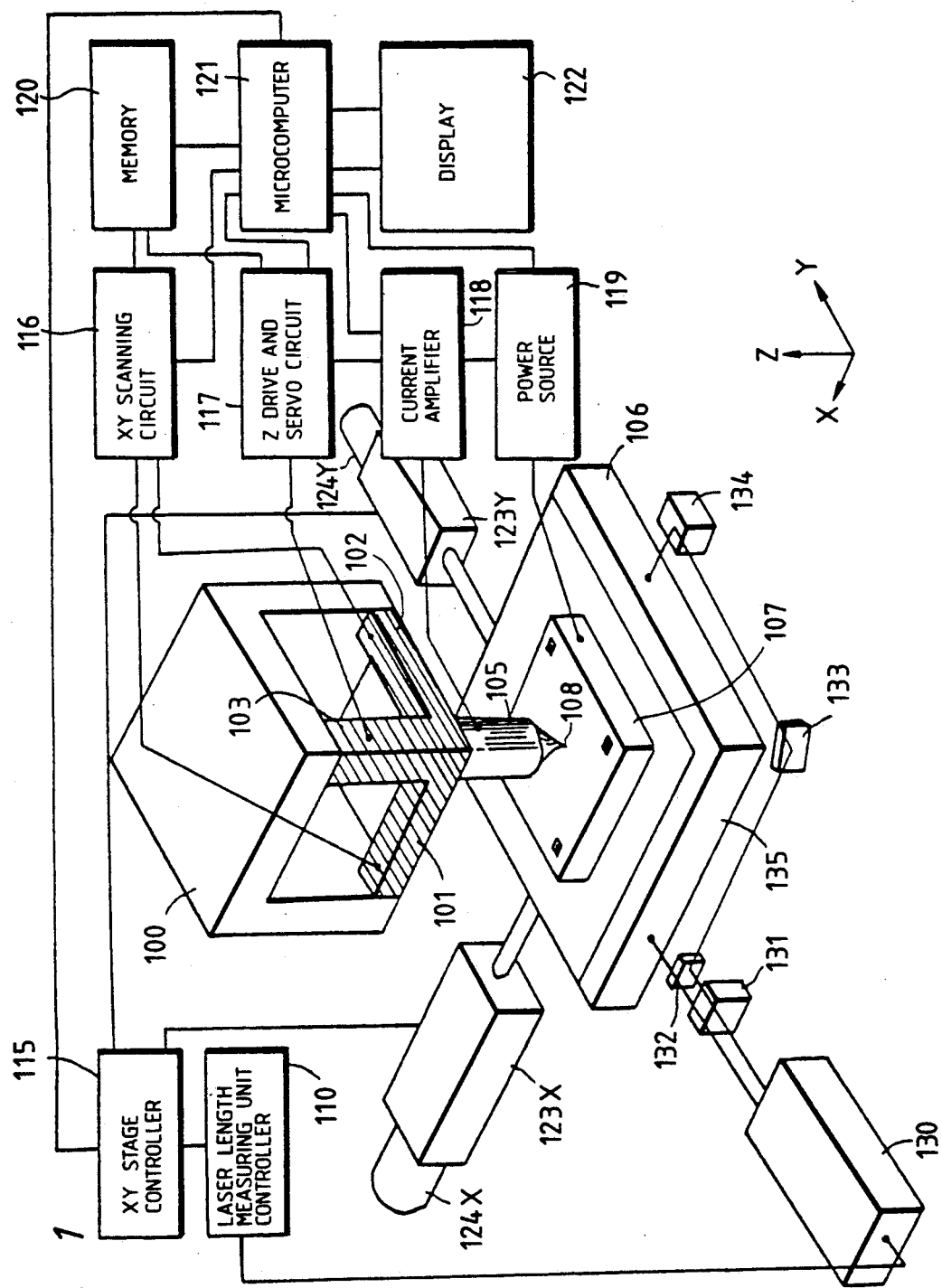
FIG. 1 shows a scanning tunnel type fine pattern processing apparatus according to an embodiment of the present invention.

Referring now to the drawings, an apparatus for processing a fine pattern embodying the present invention will be initially described with reference to FIGS. 2 to 5. The fine pattern processing apparatus is an improved processing apparatus utilizing a scanning tunneling microscope (STM), shown generally in FIG. 2, and capable of directly observing atoms one by one. Particularly, FIG. 3 illustrates a tunnel current creating phenomenon, in which the numeral 1123 denotes an electron cloud. If voltage from a power source 119 (FIG. 2) is applied between a needle portion 105 of the STM having an electroconductive needle 108, such as a Tungsten Carbon needle, with a tip sharpened to several microns or less and an electroconductive material sample 107 and both the needle and material are disposed in opposed relation to each other through a gap of several angstroms or larger, e.g., a gap distance of about 1 nm, a tunnel current will flow. This current is extremely sensitive to the change in distance between the two. It changes as much as one decimal place for a change in distance of 0.1 nm. Further, if the gap distance is 3 nm or more, a field emission current will flow. In this case, the tunnel current will flow between the atoms in the needle tip and the sample surface and field emission current will spread only several nm on the sample surface because of an extremely short distance.

Figure 2:
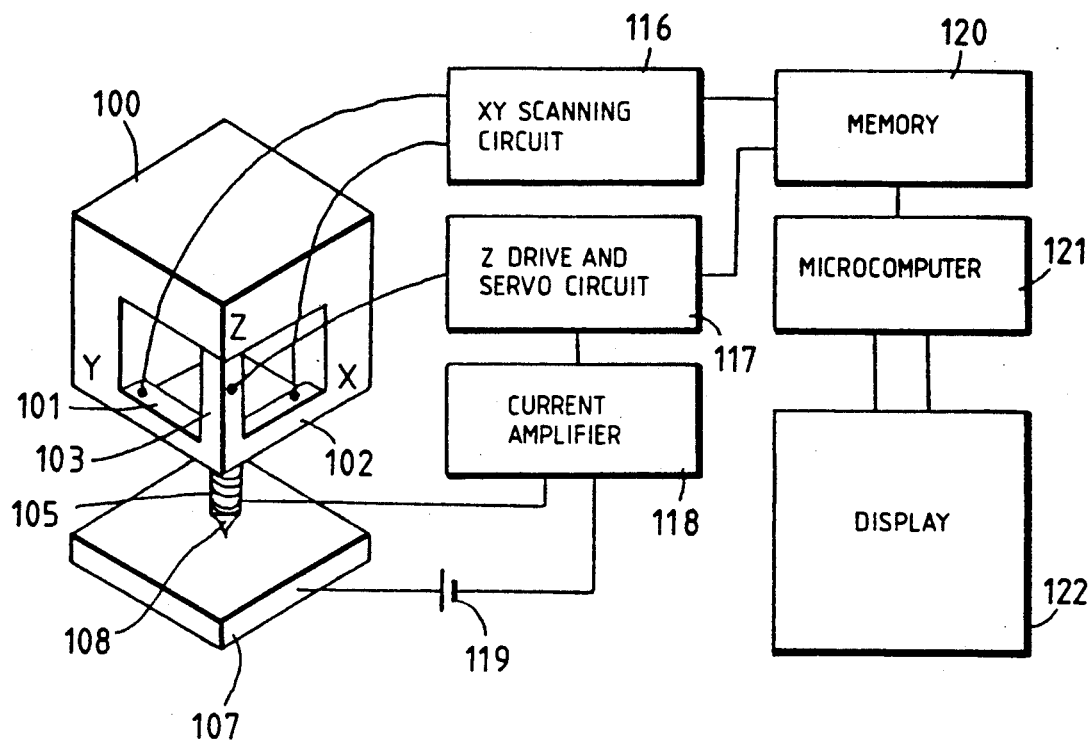
FIG. 2 shows a scanning tunneling microscope utilized in the present invention.
Figure 3:
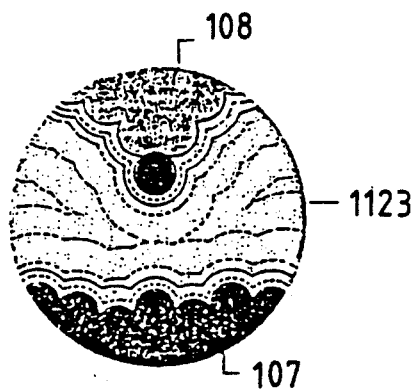
FIG. 3 shows the state of the portion between a needle and the surface of a sample in FIG. 2.

As shown in FIG. 2, the STM utilizes a three-dimensional piezoelectric actuator 100 having three piezoelectric actuators. X, Y piezoelectric actuators 101 and 102 are driven by an X-Y scanning circuit 116 while maintaining constant the tunnel current detected by a tunnel current amplifier 118. When the needle 108 reaches a convex portion of the material 107, the tunnel current detected from the tunnel current amplifier 118 increases, and a servo-circuit 117 drives a Z piezoelectric actuator 103 to raise the needle 108 until the original current is obtained. At a concave portion the needle 108 is lowered in response to the change in the detected tunnel current. Thus, the up and down movements of the needle 108 applied to the piezoelectric actuator 103 correspond to concave and convex portions of the surface of the sample 107. That is, signals applied to a memory 120 from the servo-circuit 117 correspond to those surface concave and convex portions. On the other hand, from the X-Y scanning circuit 116 to the memory 120 there are applied X-Y displacement signals corresponding to X-Y driving signals applied to the piezoelectric actuators 101 and 102. With repetition of this scanning operation, the voltage changes applied to the piezoelectric actuators 101, 102 and 103 are stored in the memory 120, and a microcomputer 121 reads out the data stored in the memory 120, images the data and displays the image on a display unit 122, whereby the surface structure of the sample material can be observed on an atomic scale.

When a bias voltage applied between the needle 108 and the sample 107 is in the range of about 1 mV to 1 V, the tunnel current is in the range of about 1 to 10 nA. In this case, the possibility of damage is small because the power applied to the sample 107 is as low as 1 pW to 1 nW.

Figure 4:
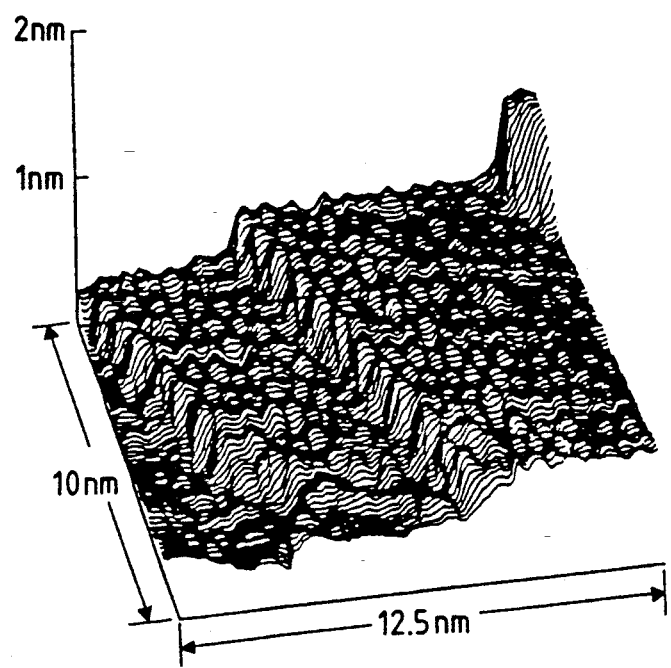
FIGS. 4 and 5 show topographic and contour maps, respectively, in the order of an atom for the sample surface observed through the scanning tunneling microscope of FIG. 2.
Figure 5:
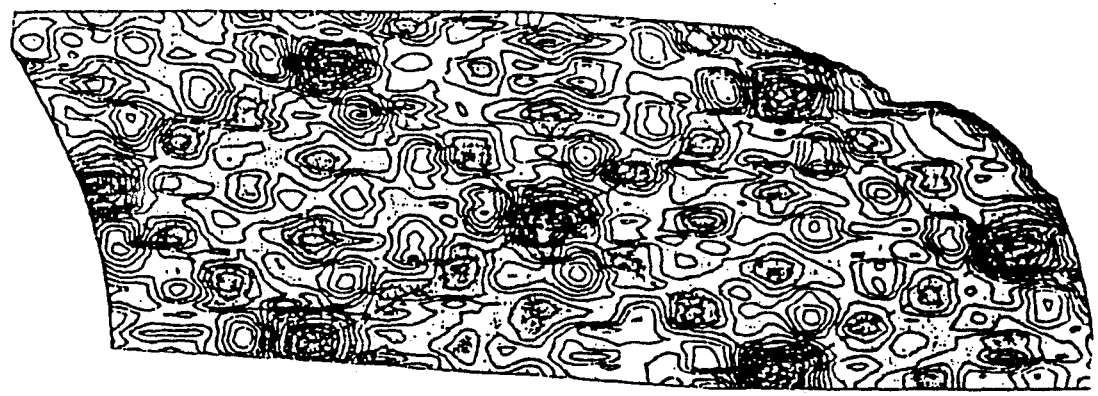

It is possible to control an inching or minute movement position of the atomic scale. For example, minute movements of about 1 nm can be effected by application of 1 V using a 1 mm square by 10 mm long piezoelectric actuator. FIG. 4 shows a topographic map of the structure of an atomic scale of a Si surface obtained by such method. Atoms are reflected one by one in concave and convex portions. FIG. 5 represents a contour line map of an STM image of a Si surface.

With the fine pattern processing apparatus of the scanning tunneling microscope (STM) system, in accordance with the present invention, not only the observation of a sample and fine pattern in the unit of an atom can be effected, but also it is possible to effect fine film formation as well as removal, addition or alteration in the unit atom or molecule.

FIG. 1 shows a basic construction of the scanning tunneling type fine pattern processing apparatus. In accordance with a command from the microcomputer 121, the three-dimensional actuator 100 of the tunnel unit actuates the X-Y scanning circuit 116 and the Z drive and servo circuit 117, which issue driving signals to drive the piezoelectric actuators 101, 102 and 103 in X, Y and Z directions, respectively, thereby causing the needle portion 105 fixed thereto to effect minute movement in X, Y, Z directions. An XY stage controller 115 causes a stage 106 to perform a coarse movement by controlling drive mechanisms 123X, 123Y and motors 124X, 124Y on the basis of a command provided from the microcomputer 121 and positional data of the stage 106 measured by a laser length measuring unit 109 which is controlled by a laser length measuring unit controller 110. The position control for the stage 106 is performed by the XY stage controller 115 so that the command target position) from the microcomputer 121 corresponds to a precise position data of the stage obtained from the controller 110. The laser length measuring unit controller 110 measures precise position data of the stage by using the laser length measuring unit 130, mirrors 132, 133, 134, 135, and a deflecting prism 131.

Further, a gas atmosphere is formed between the sample 107 and the needle 108 and a tunnel current or a field radiation current flows therebetween, causing the atoms or molecules of the gas to be radicalized, ionized or excited by electron collision, whereby the sample 107 can be subjected to sputtering, chemical etching or CVD film formation in the order of one to several atoms or molecules.

Figure 6:
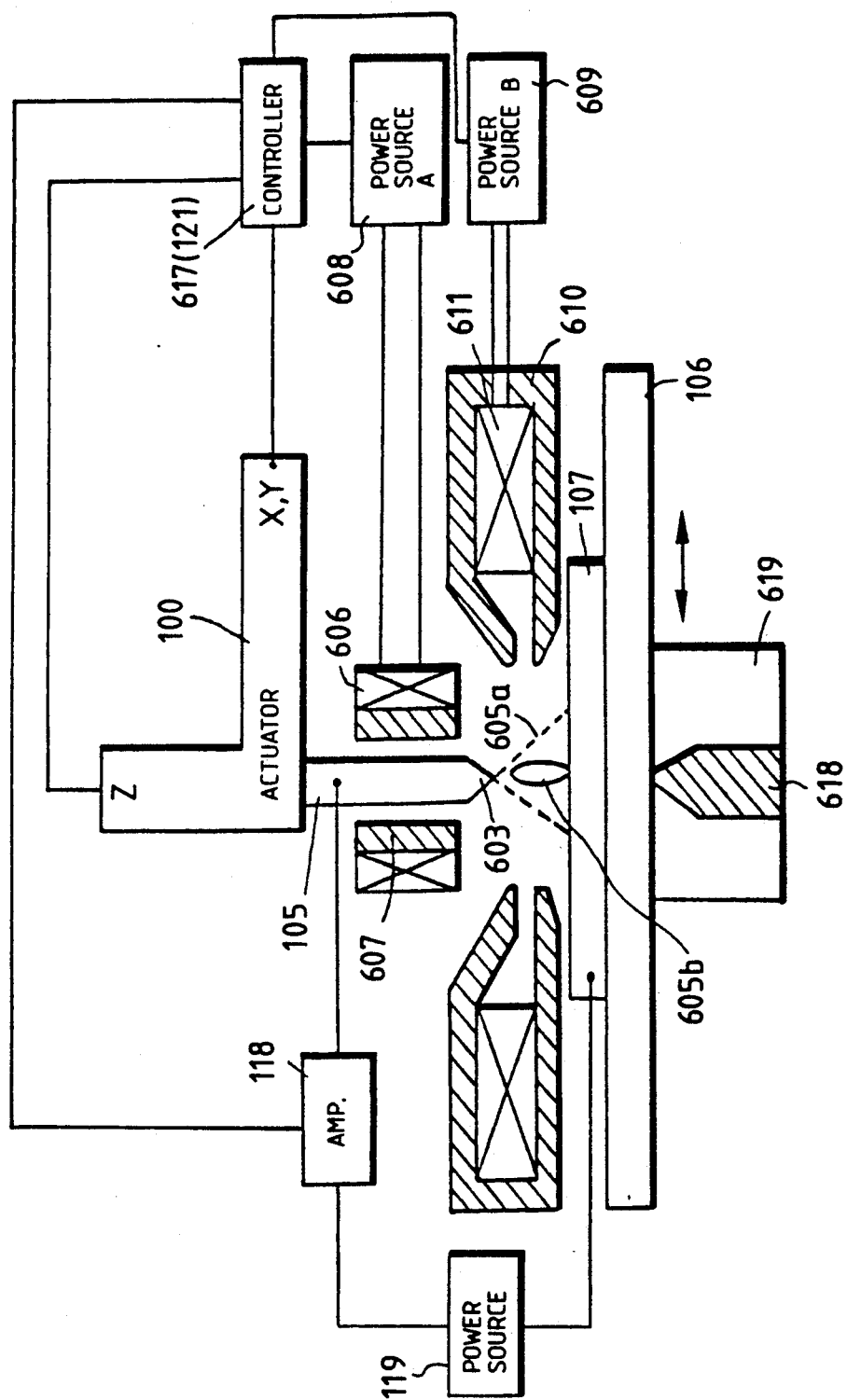
FIG. 6 is a sectional view of a portion of a scan tunnel type fine pattern processing apparatus according to another embodiment of the present invention.

FIG. 6 shows another embodiment of a fine pattern processing apparatus of a scanning tunneling type. In the previous embodiment, the tunnel current or the field emission current flowing between the needle 108 of the needle portion 105 attached to the actuator 100 constituted by piezoelectric actuators (X, Y, Z directions), and the sample 107, spreads and is radiated to a wide area of the sample as shown by broken line 605a. The apparatus shown in FIG. 6 prevents such spreading. More specifically, the scanning tunneling type fine pattern processing apparatus is provided with a lens and deflector utilizing a magnetic field or electric field to focus or deflect the tunnel current or the field emission current. FIG. 6 illustrates the apparatus provided with a magnetic field lens and deflector. The numeral 618 denotes a magnetic pole; numeral 106 denotes a sample carrier stage; numeral 610 denotes a magnetic pole of a focusing lens; numeral 611 denotes a coil thereof; and numeral 609 denotes a coil power source B. Further, in the upper portion adjacent the needle portion 105 there are mounted a magnetic pole 607 and a coil 606 which is driven by a coil power source A indicated by numeral 608. Numerals 607 and 608 may be a focusing lens and a power source thereof, or may be a deflector and a power source thereof. In the case of a focusing lens, the tunnel current or the field emission current is focused by the magnetic poles 607, 610, 618 and the intensity of magnetism provided thereto, and is radiated as a focused beam 605b to the sample 107, whereby it is made possible to effect radiation of electric current, detection and processing for a very narrow area of the sample which area is from 1 nm or less to several atoms, one atom or less.

The degree of focusing of the above focused beam can be changed by changing the intensity of magnetic field provided to the magnetic poles 607, 610, 618 by means of the coil power sources 608 and 609, and hence the irradiation region can be changed. Where members 606 and 607 serve as deflectors, the deflection of the beam is performed thereby, and in place of moving the actuator 100, the beam is slightly deflected, thereby permitting positioning with high accuracy and scanning at high speed. If the apparatus is constructed so that the magnetic poles and coils 607, 606, 610, 611, 606, 618 move together with the actuator 100 and the needle portion 105, it is possible to align the axes of these systems always with the axis of the needle. The coil power sources 608 and 609 are controlled by a controller 617 (it is apparent that the microcomputer 121 may be used), whereby it is made possible to control the strengths of these components with respect to each other or impart a picture drawing function thereto. In these cases, even if electrostatic type deflectors, lenses, and power sources for them are used in place of the electromagnetic type deflectors, lenses, and power sources, it is possible to achieve the same focusing as shown by the focused beam 605b.

Figure 7:
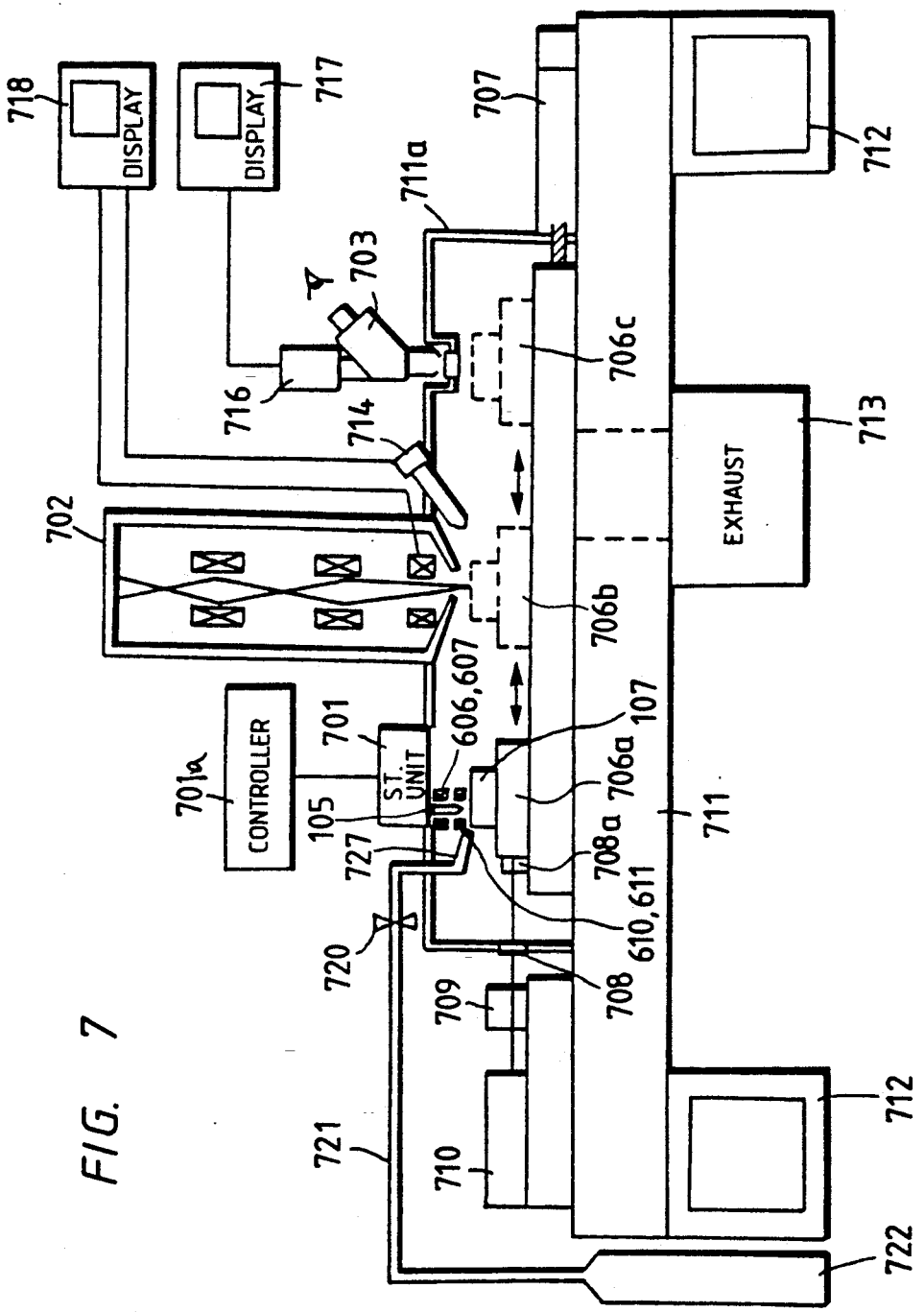
FIG. 7 is a sectional view of a film forming apparatus utilizing the scan tunnel type fine pattern processing apparatus of the present invention.

FIG. 7 shows a scanning tunneling type fine pattern processing apparatus according to a further embodiment of the present invention. This apparatus includes a surface plate 711 mounted on a deoscillating base 712 such as an air servo mount, a vacuum vessel 711a mounted on the surface plate 711, a sample carrier stage 706 mounted on the vacuum vessel 711a and movable to positions represented by 706a, 706b and 706c, a scanning tunneling unit 701 (as shown in FIG. 1 and 6) provided with a needle portion 105 having a needle 108 and also provided with a piezoelectric actuator 100 and controller 701a, an SEM (scanning electron microscope) 702 and an optical microscope 703. The sample carrier stage 706 is moved by a driving portion 707 and can take a position 706a of the scanning tunneling unit, a position 706b for observation by SEM and a position 706c for observation by an optical microscope. To the tunneling unit 701 are attached focusing and deflecting poles and coils 606, 607, 610, 611 (as shown in FIG. 6) to focus or deflect the beam of tunnel current or field emission current. In this case, the stage position can be measured and set at a high accuracy of 0.1 μm or less by means of a laser length measuring unit 710, a polarizing prism 709, a window 708 and a mirror 708a attached to the sample carrier stage 706.

Near the scanning tunneling unit 701 there is provided a gas nozzle 727 for enabling gas to be blown to the vicinity of the needle 108 of the scanning tunneling unit 701 from a gas cylinder 722 through a pipe 721 and a valve 720 which serves for turning on and off gas flow and gas flow adjustment. Different gases may be utilized including organometallic compound gases, polymer gases such as silane, and reactive gases such as halogen and compounds thereof. By blowing of the gas, it is not only possible to perform the aforedescribed processing, but also to effect local film formation or speed-up etching for metals and insulators such as $SiO_2$ at the time of radiation of the tunnel current or the field emission current by the apparatus and processes described below.

In this apparatus, by the following process it is made possible to effect local processing, local film formation or local speed-up etching in a desired position of a sample, e.g. a substrate 107 having a fine circuit pattern.

First, the sample is placed in the vacuum vessel 711a through a loader chamber (not shown), and exhaustion is performed by a vacuum exhaustion system 713. Then, the sample carrier stage is moved to the position 706c, and a desired part of the sample 107 is detected by direct observation through a window or the optical microscope 703 or by observation through them and further through a camera 716 and a display 717. Then, the sample carrier 706 is moved to the position 706b of the SEM 702 and a secondary electron emitted from the sample 107 is detected by a detector 714 on the basis of the rough observation made by the optical microscope 703, and the result of the detection is displayed on a display 718. In this way minute observation and positioning are performed. Next, the sample carrier stage 706 is transferred to the position 706a and a finer detection is performed by microscopic observation using the scanning tunneling unit 701, whereby positioning is made finally to an atom, a group of atoms or a molecule to be processed, to which there can be applied a processing such as removal, adhesion or speed-up etching. In this case, the resolving power of detection can be successively increased from the order of μm with the optical microscope 703, to 10-1 nm with the SEM 702, and to 0.1-0.01 nm by driving the piezoelectric actuators 101, 102 and 103 using the scanning tunneling unit XY scanning circuit 116 and the Z drive and servo circuit 117, detecting a tunnel current or a field emission current by the current amplifier 118 and displaying the result of the detection on the display 122 through the processing made by the microcomputer 121, as shown in FIG. 1. Since the observation area and the resolving power overlap between the optical microscope and the SEM and between the SEM and the scanning tunneling microscope, the operations up to the positioning of atomic order can be performed continuously from the field of vision of the optical microscope by using the arrangement described above.

Figure 8A:
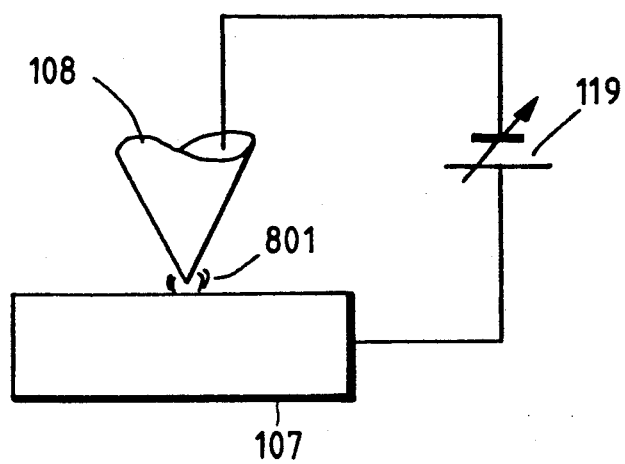
FIGS. 8 to 17 are view showing processing, film forming and annealing in the unit of an atom or molecule utilizing the apparatus shown in FIGS. 1, 2, 6 and 7.
Figure 8B:
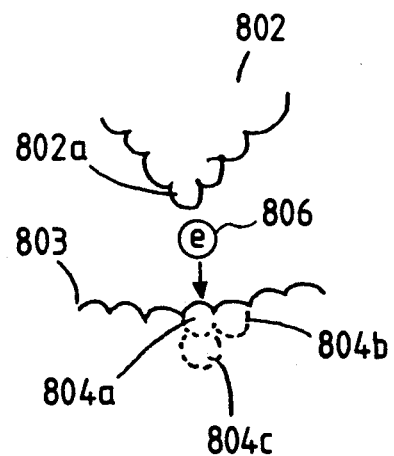
Figure 8C:
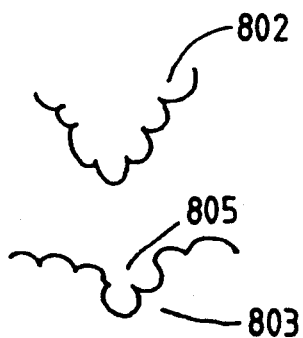

FIGS. 8(a) to 8(c) illustrate the details of processing of atomic or molecular order, i.e., in units of an atom or molecule, carried out by the present invention. FIG. 8(a) shows a state wherein the needle 108 of the needle portion 105 is drawn close to the surface of the sample 107, voltage is applied between the two by the power source 119 and a tunnel current or a field emission current 801 flows. FIG. 8(b) shows the state of a tip 802 of the needle 108 and a surface 803 of the sample 107. More specifically, the tunnel current is discharged from an atom 802a of the needle tip 802 with respect to an atom 804a of the sample and an electron 806 is emitted. As a result, the atom 804a and nearby atoms 804b, 804c are removed by the resulting energy to form a hole 805 of such an atomic or molecular level as shown in FIG. 8(c).

Figure 9A:
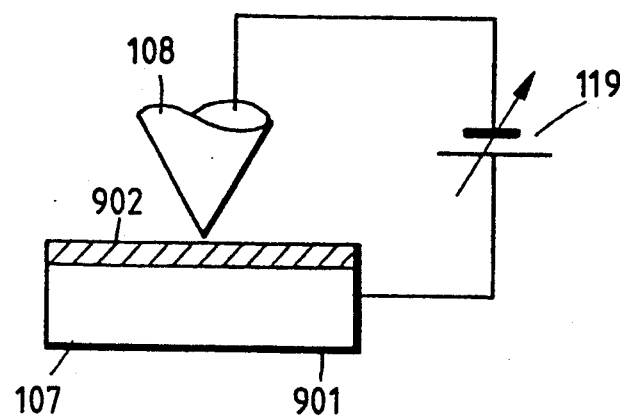
Figure 9B:
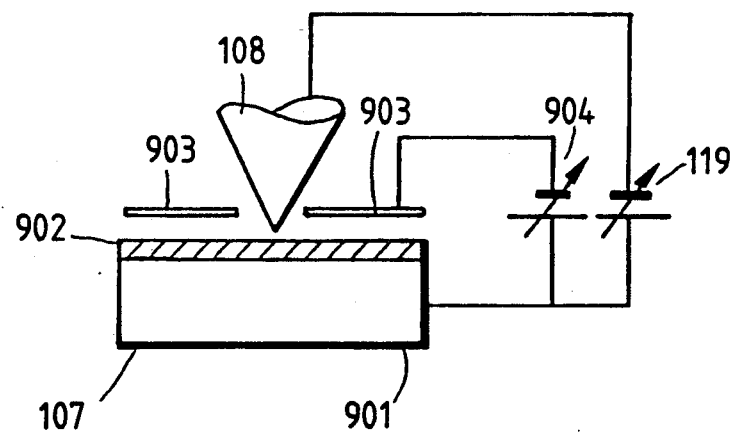
Figure 10A:
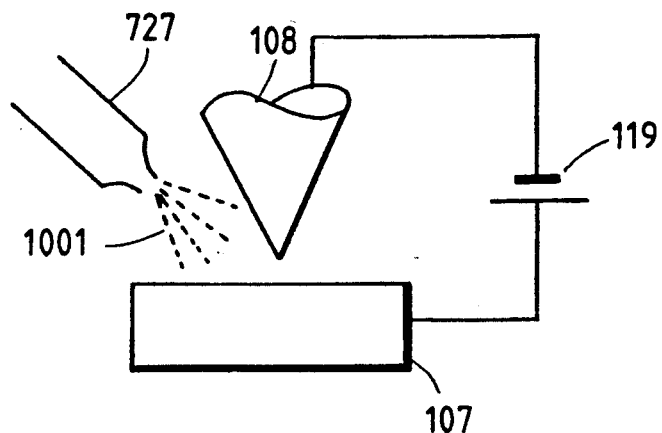
Figure 10B:
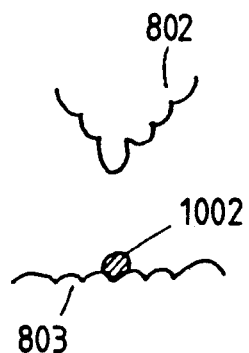
Figure 10C:
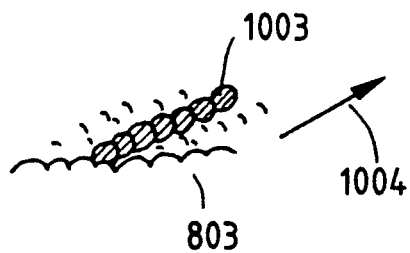
Figure 10D:
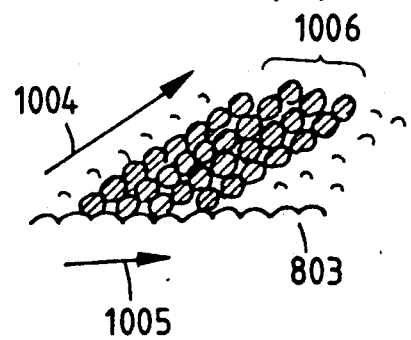

FIG. 9(a) shows the case where processing is effected for an insulating material 902 formed as the sample 107 on an electroconductive substrate 901. Also in this case, if the insulating film is sufficiently thin, the surface of the insulating material 902 will be polarized by a polarization effect induced by the voltage applied between the needle 108 and the electroconductive substrate 901, whereby a tunnel current or a field emission current flows to permit processing of the insulating film material 902 as the sample 107. In FIG. 9(b), electrode plates 903 for polarization are mounted around the needle 108 for enhancing the polarization effect. Voltage is applied to the polarizing electrode plates 903 independently of the needle 108 by means of a power source 904 to polarize the insulating material 902 in advance. In this state, voltage is applied to the needle 108 by means of a power source 119 to facilitate tunnel current or field emission current flow as described with respect to FIG. 9(a).

FIG. 10 shows the case where gas is blown from the nozzle 727 to the vicinity of the tip of the needle 108 of the needle portion 105 as shown in FIG. 7. More specifically as shown in FIG. 19(a), gas 1001 is blown from the gas nozzle 727 to the vicinity of the needle 108 and of the portion of the sample 107 opposed to the needle, and in this state voltage is applied from the power source 119 and a tunnel current or a field emission current flows. In this case, if there is used as the gas a metallic compound for CVD (chemical vapor deposition) such as an organometallic compound, examples of which include metal-alkyl compounds such as $Al(CH_3)_3$, $Al(C_2H_5)_3$, $Al(C_4H_9)_3$, $Cd(CH_3)_2$ and $Cd(C_2H_5)_2$, metal-carbonyl compounds such as $M(CnH_{2n+1})m$ and $MO(CO)_6$, metal-alkoxide compounds such as $M(CO)N$ and $TaO(C_2H_5)_5$, $M(OCH_{2n+1})m$, and metal halides, i.e. $MXn$ such as $WF_6$ and $WCl_6$ wherein M is a metal element, e.g. W, Mo, Ta, Al, Cd, Zn, Ni, or Zr, m and n are each an integer, and X is a halogen element such as, for example, F, Cl, or Br, this substance is subject to the action of the tunnel current or the field emission current and is decomposed by the energy of the current so that a metal atom is separated and adheres to the surface 803 of the sample 803 in the position 1002 as shown in FIG. 10(b). At this time, as shown in FIG. 10(c), there can be obtained a train of adhered atoms 1003 on the sample surface 803 by operating the piezoelectric actuator 100 of the tunneling unit 701 and thereby moving the tip 802 of the needle 108 in the direction shown by arrow 1004 on the surface 803 of the sample 107. FIG. 10(d) shows that a large number of atoms can be adhered onto an area 1006 by scanning the tip 802 of the needle 108 in the direction of arrow 1004 with respect to the sample 107, then moving the tip by one atom in the direction of arrow 1005, further moving it in the direction of arrow 1004 and repeating this process. In this manner, a film layer of such atoms is formed in a specified area. Although, the above is an example of adhesion of metal atoms, it is also possible to effect the adhesion of such an insulating material as $SiO_2$ by using a nonmetallic compound gas such as TEOS (tetra-ethyl-orthosilicate).

Figure 11A:
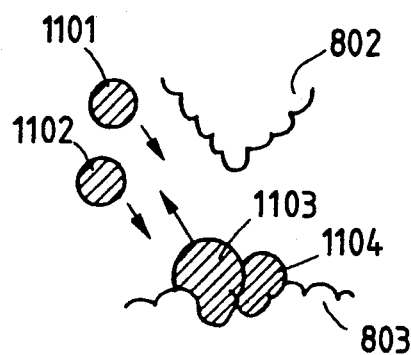
Figure 11B:
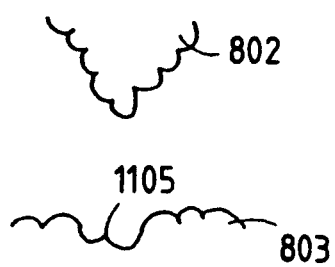

FIG. 11(a) shows the case where reactive gases such as halogen and halogen compound gases, e.g., fluorine, chlorine, $CCl_4$, $CF_4$ are blown out from the nozzle 727. Molecules of these gases, indicated at 1101 and 1102, are decomposed or activated by a tunnel current or a field emission current flowing between the tip 802 of the needle 108 and the surface 803 of the sample 107, and are thereby bonded to sample atoms to form volatile atoms 1103 and 1104, which volatilize to form hole 1105 as shown in FIG. 11(b), thus permitting a high-speed removal.

Figure 12A:
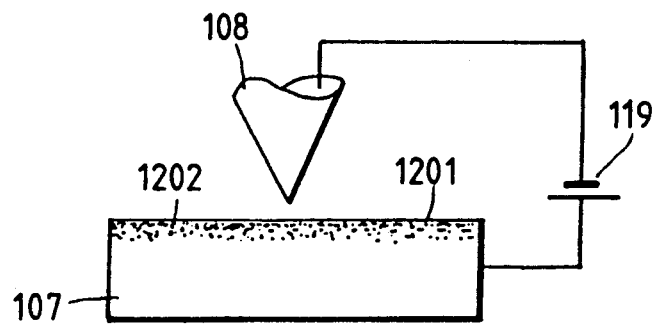
Figure 12B:
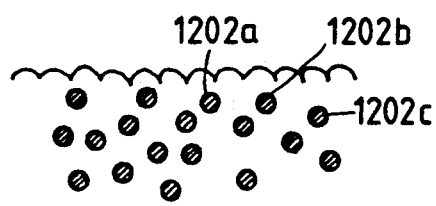
Figure 12C:
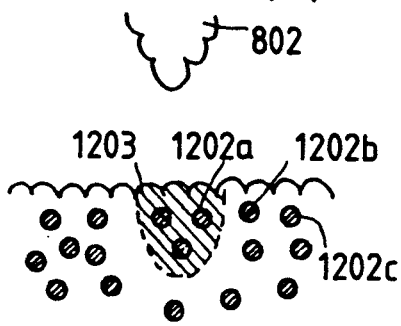
Figure 13A:
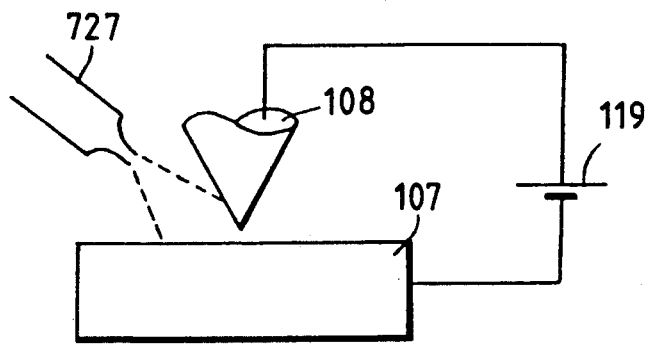
Figure 13B:
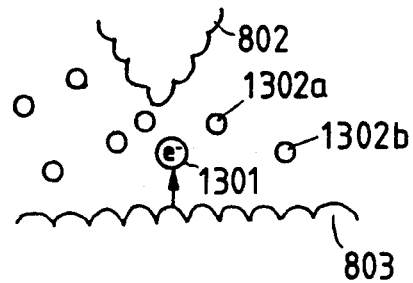
Figure 13C:
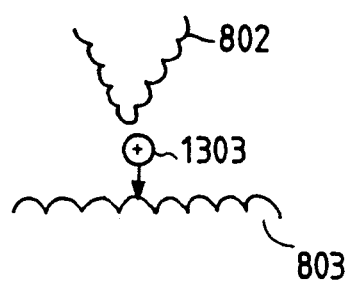
Figure 13D:
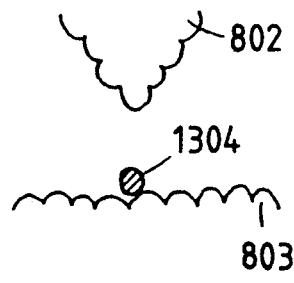
Figure 13E:
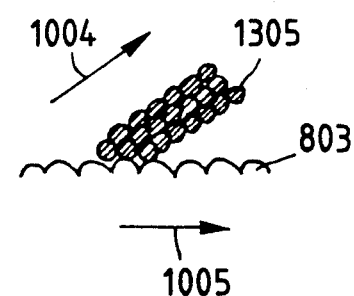
Figure 13F:
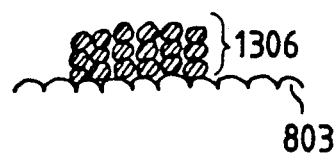

FIG. 12 shows an example of local annealing performed by the scanning tunneling type fine pattern processing apparatus of the present invention. In FIG. 12(a), the sample 107 has an impurity 1202 implanted in a substrate 1201 of a semiconductor, for example, by ion implantation. In an unannealed state, the impurity 1202a, 1202b, 1202c, as shown in FIG. 12(b) is not electrically activated due to the presence of a lattice defect or the remaining of internal strain. Therefore, by using the scanning tunneling type fine pattern processing apparatus, voltage is applied between the needle 108 and the sample 107 from the power source 119 to radiate a tunnel current or a field emission current locally and only the area 1203 of several atoms is annealed by the resulting energy as shown in FIG. 12(c), whereby impurities 1202a-1202c can be activated, only impurity 1202a being shown as activated. Thus, by locally annealing an area of several atoms in the material with impurities 1202a-1202c implanted in the whole surface thereof to change its electrical characteristics, there can be formed an ultra-fine circuit in the unit of an atom, a group of atoms or a molecule.

FIG. 13 shows a further example of processing in accordance with the present invention. As shown in FIG. 13(a), in contradistinction to FIG. 8, for example, the polarity of the power source 119 is reversed and positive and negative voltages are applied to the needle 108 and the sample 107, respectively. In this case, as shown in FIG. 13(b), an electron flows not from an atom of the tip 802 of the needle 108, as shown in FIG. 8, but rather the electron 1301 flows from the surface portion 803 of the sample 107, which is close to the needle, toward the needle tip 802. If gas is blown from the gas nozzle 727 to the portion between the tip 802 of the needle 108 and the surface 803 of the sample 107 or thereabout, gas atoms 1302a and 1302b are ionized by the action of the flowing electron. An ion 1303 thus formed flows to the surface 803 of the sample 107 to which is applied a negative voltage, as shown in FIG. 13(a), and it adheres as a gas atom 1304 onto the sample surface 803, as shown in FIG. 13(d). Now, if the needle 108 and the sample 107 are moved in a relative manner by the actuator 100 of a piezoelectric element for example, to scan the needle tip 802 in two dimensions in the direction of arrows 1004 and 1005 on the sample surface, as shown in FIG. 13(e), there is formed a wide gas atom adhered area 1305 on the surface 803 of the sample 107. By repeating this process, atoms can be laminated as a multi-layer film 1306 as shown in FIG. 13(f).

Figure 14A:
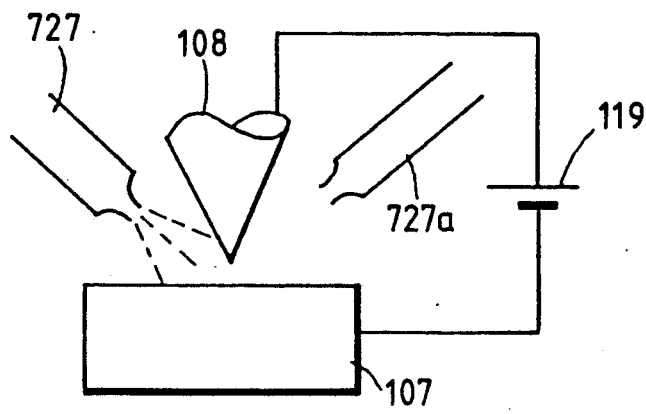
Figure 14B:
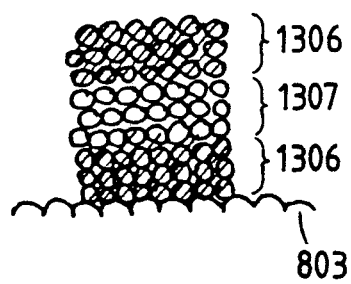

Further, as shown in FIG. 14(a), by providing plural gas nozzles 727, 727a and flowing two or more kinds of gases alternately from those nozzles, there can be laminated in multi-layers different kinds of atomic layers represented by a layer or layers 1306 of atoms from the first nozzle 727 and a layer or layers 1307 of atoms from the second nozzle 727a, as shown in FIG. 14(b).

Figure 15A:
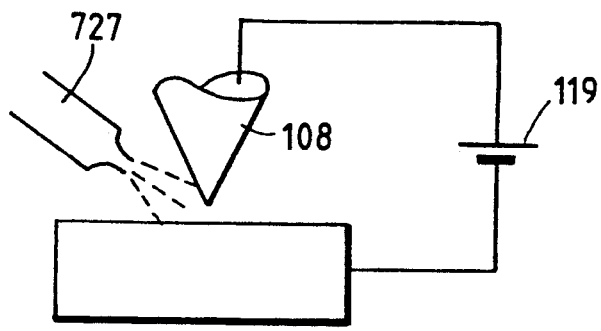
Figure 15B:
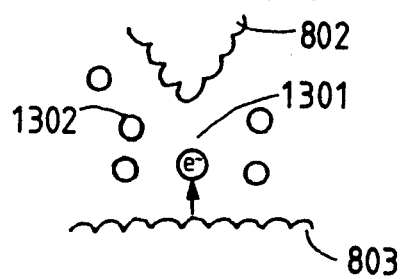
Figure 15C:
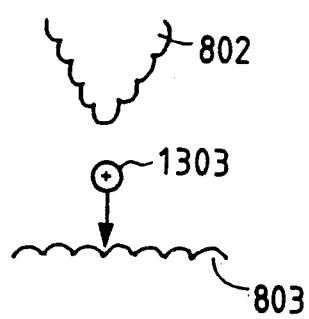
Figure 15D:
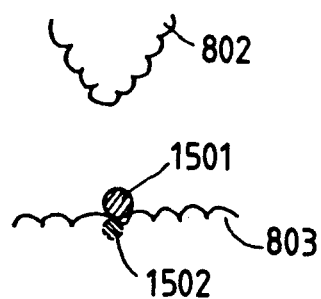
Figure 15E:
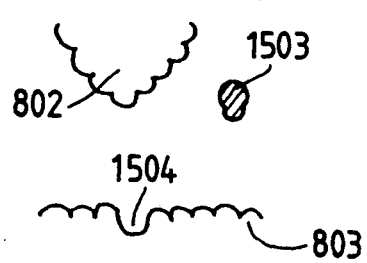

FIG. 15 shows another processing method utilizing the arrangement of FIG. 15(a). As shown in FIGS. 15(b) and 15(c), an electron 1301 emitted from the surface 803 of the sample 107 ionizes a gas atom 1302 and the resulting ion 1303 adheres to the sample surface 803. At this time, if there is used a combination wherein an ion 1501 of the gas atom and a sample atom 1502 bond together to form a compound 1503 of high vapor pressure, as shown in FIG. 15(d), the compound 1503 vaporizes as shown in FIG. 15(e) and an atom 1503 is removed from the sample surface 803 to form a cut-out portion (processed hole) 1504.

Figure 16A:
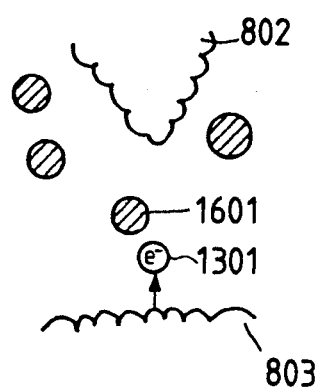
Figure 16B:
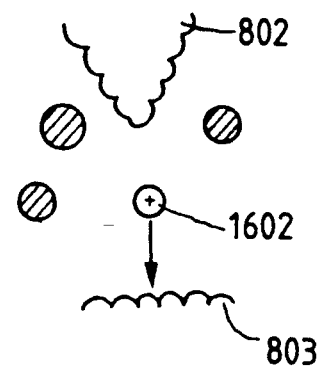
Figure 16C:
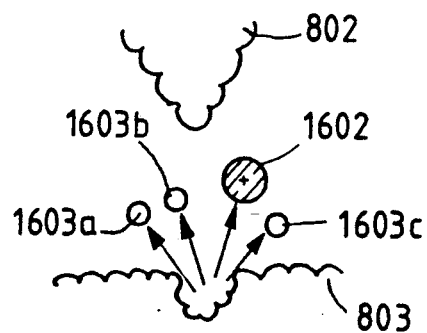

In FIG. 16(a), a heavy element 1601 is used as a gas atom emitted from the nozzle 727 in the apparatus illustrated in FIG. 15(a). This atom is ionized by the action of an electron 1301 emitted from the sample surface 803 and the resulting heavy ion indicated at 1602 in FIG. 16(b) advances toward the sample surface to which a negative voltage is applied. The resulting collision induces a sputtering action, whereby sample atoms 1603a, 1603b, 1603c... are emitted and removed as shown in FIG. 16(c).

Figure 17A:
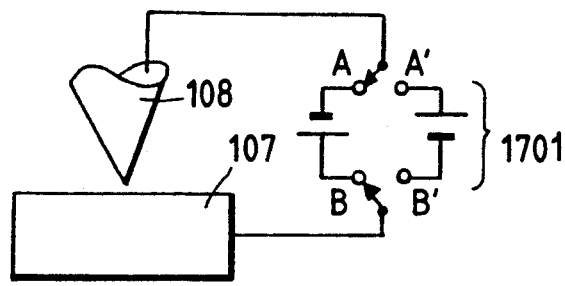
Figure 17B:
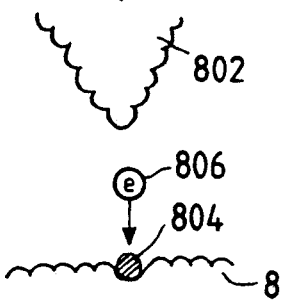
Figure 17C:
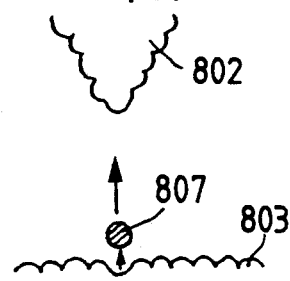
Figure 17D:
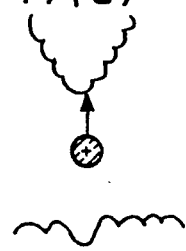
Figure 17E:
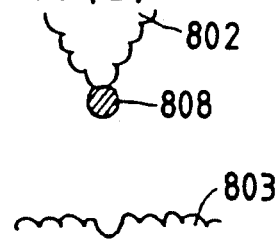
Figure 17F:
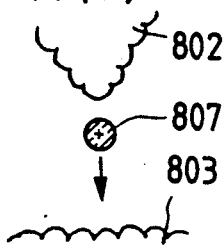
Figure 17G:
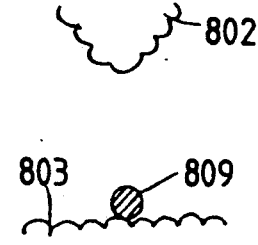

FIG. 17(a) shows an embodiment for repositioning atoms or molecules of the sample 107 in the unit of an atom by using a device provided with a power source 1701 having a switch capable of changing over from one polarity to another polarity. More specifically, if the switch of the power source 1701 is held in the state of A, B and negative and positive voltages are applied to the needle 108 and the sample 107, respectively, an electron 806 flows from the needle tip to the sample surface, as shown in FIG. 17(b). By this action an atom 804 of the sample surface 803 is ionized into a positive ion 807 as shown in FIG. 17(c), which moves toward the needle tip 802 as shown in FIG. 17(d) and adheres as atom 808 to the needle tip 802 as in FIG. 17(e). Next, the sample 107 and the needle 108 are moved in a relative manner by the operation of the piezoelectric element actuator 100 to move the needle tip 802 to another part of the sample. Now, if the switch of the power source 1701 is switched to the A', B' side, the polarity is reversed and the atom 807 is positive-ionized as shown in FIG. 17(f), leaves the needle tip 802, moves to the sample surface 803 and adheres as atom 809 onto the sample surface 803 as shown in FIG. 17(g). If the distance of movement in each of X and Y directions from the position of atom to be removed up to the position of atom to be adhered is observed using the scanning tunneling unit, then after removal of the atom from the surface 803, the removed atom can be adhered to a predetermined position by being moved in the X and Y directions by control of the piezoelectric element actuator. Thus, it is possible to affect repositioning operations in the unit of atom.

The technique described above can be applied to circuit correction or circuit alteration for a lithography mask, etc. for the production of a ULSI or an ultra-fine LSI. Further, while the above description referred to ionizing or exciting the electrons and molecules of gas by electron collision, radicalizing is also encompassed thereby.

Figure 18A:
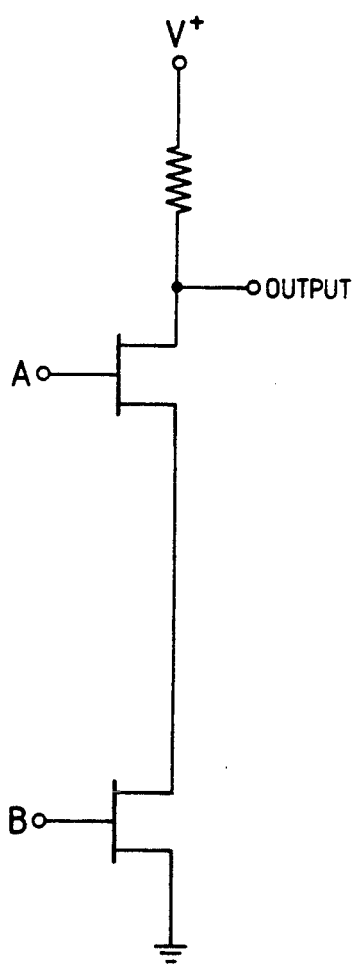
FIGS. 18(a-b) show a circuit diagram and a corresponding molecular device.
Figure 18B:
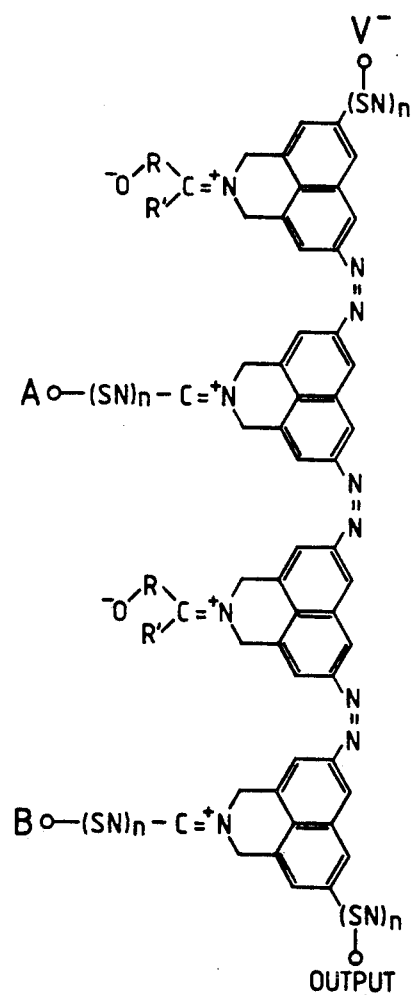

In a molecular device or a biodevice, an element is formed basically by linkage or combination of atoms or molecules, and the technique for separating or altering that linkage is important in the correction of poor characteristics or analysis of the element. That is, in molecular devices and biodevices, the removal and connection in the unit of an atom or molecular are extremely important. FIG. 18(a) illustrates a NAND current having two inputs A and B and an output, with FIG. 18(b) illustrating the equivalent molecular electronic device using molecules for switching as proposed by F. Carter in Physics, 10D, 1984, pp. 175. In FIG. 18(b), the functional group $>C=N^+$ having a nitrogen ion corresponds to the controlling portion. When electrons are injected through one of the input lines of the conductive polymeric chain of $(SN)n$, positive charges of the nitrogen atom are neutralized causing a potential change, which stops the electron current flow from the V terminal to the output. In case that electrons are injected through another of the input lines or both input lines, the potential changes also stop the electron current flow from the V terminal. Therefore, this molecular device works as a NAND circuit and such a fine molecular device can be integrated in a density of $10^6$ higher than the usual semiconductor devices. By the application of the technique described above for processing or adding materials in the unit of atom or molecule, the linkage or combination of atoms or molecules of a molecular or biodevice can be altered or corrected.

According to the present invention, as described above, not only it is possible to effect correction and alteration of a circuit pattern of 0.2 μm or less of, such as a thin inorganic material film, but also in a molecular device it is possible to produce an element by performing processing, adhesion, etc., in the unit of an atom or molecule.

While we have shown and described several embodiments in accordance with the present invention, it is understood that the same is not limited thereto but is susceptible to numerous changes and modifications as known to one of ordinary skill in the art, and we therefor do not wish to be limited to the details shown and described herein but intend to cover all such modifications as are encompassed by the scope of the appended claims.

What is claimed is:

1. A method for processing a fine pattern of a sample of one of an electronic device, molecular device and bioelement device, comprising the steps of:

coarsely aligning the sample mounted on a movable stage by moving the stage in at least an x-y direction in accordance with measured positional data of the stage;

finely scanning a needle having a sharpened tip disposed in opposed relation to the coarsely aligned sample and with a gap therebetween in three-dimensional directions by driving of an actuator;

applying a voltage between the needle and the sample so as to enable at least one of a tunnel current and a field emission current to flow therebetween;

displaying at least three-dimensional displacement data of the needle obtained from the actuator while controlling at least a z-directional displacement of the needle in accordance with one of detected tunnel current and detected field emission current obtained by detecting at least one of the tunnel current and field emission current flowing between the needle and the sample so as to observe the surface structure of the sample on an atomic scale;

focusing at least one of the tunnel current and the field emission current by applying one of a controllable first magnetic field and a controllable first electrostatic field;

finely deflecting at least one of the tunnel current and the field emission current by applying one of a contrallable second magnetic field and a controllable second electrostatic field; and processing the fine pattern to correct the fine pattern by effecting at least one of removal, repositioning annealing and film formation of at least one of individual atoms and individuals molecules by the flow of at least one of the focused and finely deflected tunnel current and field emission current when the needle is finely positioned in accordance with the observed surface structure of the sample by finely scanning the needle in the three-dimensional directions by driving of the actuator.

2. A method according to claim 1, wherein the step of coarsely aligning includes obtaining measured positional data of the stage by laser length measuring units, and the step of finely scanning the needle by driving the actuator includes driving a three-dimensional piezoelectric actuator.

3. A method according to claim 1, wherein the step of focusing the controlling one of a first magnetic field means for generating the first controllable magnetic field and a first electrostatic field means for generating the first controllable electrostatic field, the step of finely deflecting includes controlling one of a second magnetic field means for generating the second controllable magnetic field and a second electrostatic field means for generating the second controllable electrostatic field, the controlling the of the one of the first magnetic field means and the first electrostatic field means being independent of the controlling of the one of the second magnetic field means and the second electrostatic field means.

4. A method according to claim 1, wherein the sample is an insulating material formed on an electroconductive substrate, and further comprising the steps of:

disposing at least one electrode plate in a region around the needle and spaced from the insulating material for enabling polarization of the insulating material of the sample;

applying another voltage to the at least one electrode plate for polarizing the insulating material of the sample and applying the voltage including the voltage between the needle and the electroconductive substrate so as to enable the flow of at least one of the tunnel current and the field emission current; and effecting processing of the insulating material.

5. A method according to claim 1, further comprising the step of forming a gas atmosphere in the region between the needle and the sample for enabling at least one of radicalizing, ionizing and exciting electrons and one of atoms and molecules of the a gas by electron collision.

6. A method according to claim 5, further comprising the steps of separating one of an atom and molecule of the gas and depositing one of the atom and molecule of the gas on the sample, effecting relative movement of the needle and the sample in a first direction, separating one of another atom and molecule of the gas and depositing the one of the separated another atom and molecule adjacent the one of the deposited atom and molecule so as to form a film layer of one of individual atoms and molecules on the sample.

7. A method according to claim 6, further comprising the steps of effecting relative movement of the needle and the tip in a second direction and separating one of a gas atom and molecule and depositing the one of the separated gas atom and molecule adjacent one of the gas atom and molecule separated and deposited in the first direction so as to effect film formation of one of separated atoms and molecules on the sample extending in the first and second directions.

8. A method according to claim 6, wherein the step of forming a gas atmosphere, separating and depositing includes forming a gas atmosphere of a first gas to effect film formation of one of atoms and molecules of the first gas, stopping supply of the first gas and supplying a second gas to the region of the needle and the sample, separating one of an atom and molecule of the second gas and depositing the separated one of the atom and molecule of the second gas on the film layer of one of deposited atoms and molecules of the first gas, and effecting relative movement of the sample and needle in at least the first direction so as to effect film formation of one of atoms and molecules of the second gas on the film of one of atoms and molecules of the first gas.

9. A method according to claim 10, wherein the gas is one of a metallic compound gas and a non-metallic compound gas.

10. A method according to claim 1, wherein the sample is a substrate having an impurity implanted therein, the impurity being non-electrically activated in an unannealed state, and effecting annealing of one of individual atoms and molecules by irradiation of at least one of the tunnel current and field emission current to a local area of the substrate so as to effect a change in the electrical characteristics by electrically activating one of individual atoms and molecules of the implanted impurity.

11. A method according to claim 1, wherein the step of applying a voltage between the needle and the sample includes applying a voltage of a first polarity to the needle and an opposite polarity to the sample so as to cause an electron to flow from the needle to the sample to ionize one of an atom and molecule of the sample and cause movement of the one of the atom to the needle for adherence thereat, effecting relative movement of the needle and the sample, reversing the polarity of the voltage applied to the needle and the sample so that the opposite polarity voltage is applied to the needle and the first polarity voltage is applied to the sample so as to cause ionization of the one of the atom and molecule adhered to the needle and movement of the one of the ionized atom and molecule to the sample surface for deposit and adherence thereon, thereby enabling repositioning of one of an atom and molecule of the sample.

12. A method according to claim 1, wherein the step of processing includes at least one of removal, repositioning, annealing and film formation utilizing one of a single atom and a single molecule of the one of the electronic device, molecular device and bioelement.

13. A method for processing a fine pattern of a sample formed as an insulating material on an electroconductive substrate, comprising the steps of:

coarsely aligning the sample mounted on a movable stage by moving the stage in at least one x-y direction in accordance with measured positional data of the stage;

finely positioning a needle having a sharpened tip disposed in opposed relation to the coarsely aligned sample with a gap therebetween in three-dimensional directions by driving an actuator;

disposing at least one electrode plate for in a region around the needle and spaced from the insulating material for enabling polarization of the insulating material;

applying a first voltage to the at least one electrode plate for polarizing the insulating material;

applying a second voltage between the needle and the electroconductive substrate so as to enable at least one of a tunnel current and a field emission current to flow between the needle and the insulating material of the sample and processing the fine pattern on the insulating material of the sample by effecting at least one of removal, repositioning, and film formation of at least one of individual atoms and individual molecules processed by flow of at least one of the tunnel current and the field emission current between the needle and the polarized insulating material when the needle is finely positioned.

* * * * *